(12) United States Patent
Cao et al.

(10) Patent No.: US 9,887,282 B1
(45) Date of Patent: Feb. 6, 2018

(54) METAL SEMICONDUCTOR FIELD EFFECT TRANSISTOR WITH CARBON NANOTUBE GATE

(71) Applicant: INTERNATIONAL BUSINESS MACHINES CORPORATION, Armonk, NY (US)

(72) Inventors: Qing Cao, Yorktown Heights, NY (US); Ning Li, White Plains, NY (US); Jianshi Tang, Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/277,393

(22) Filed: Sep. 27, 2016

(51) Int. Cl.
*H01L 29/778* (2006.01)
*H01L 29/49* (2006.01)
*H01L 29/66* (2006.01)

(52) U.S. Cl.
CPC .......... *H01L 29/7786* (2013.01); *H01L 29/49* (2013.01); *H01L 29/66431* (2013.01)

(58) Field of Classification Search
CPC ............... H01L 29/7786; H01L 29/66431
See application file for complete search history.

(56) References Cited

U.S. PATENT DOCUMENTS

| | | | | |
|---|---|---|---|---|
| 5,270,574 A * | 12/1993 | Boysel | ............. | H01J 9/025 257/678 |
| 6,214,683 B1 * | 4/2001 | Xiang | ............. | H01L 21/28123 257/E21.206 |
| 2002/0024099 A1 * | 2/2002 | Watanabe | ............. | B82Y 10/00 257/368 |
| 2014/0239356 A1 * | 8/2014 | Yamamura | ............. | H01L 29/78 257/288 |
| 2015/0221884 A1 * | 8/2015 | Han | ............. | H01L 51/0545 257/29 |

OTHER PUBLICATIONS

Park, H. et al., "High-density integration of carbon nanotubes via chemical self-assembly" Nature Nanotechnology (Oct. 2012) pp. 787-791, vol. 7.

* cited by examiner

*Primary Examiner* — Matthew Landau
*Assistant Examiner* — Mark Hatzilambrou
(74) *Attorney, Agent, or Firm* — Tutunjian & Bitetto, P.C.; Louis J. Percello

(57) ABSTRACT

A method of forming an electrical device that includes forming ohmic contacts to a type III-V semiconductor substrate, and depositing a dielectric layer on the ohmic contacts and an exposed surface of the type III-V semiconductor substrate. A nanotube is positioned on a surface of the high-k dielectric that is overlying the type III-V semiconductor substrate and is between the ohmic contacts using chemical recognition. The dielectric layer is removed so that the nanotube is repositioned directly on the type III-V semiconductor substrate to provide an Schottky contact to a channel region of the type III-V semiconductor substrate.

14 Claims, 5 Drawing Sheets

METAL SEMICONDUCTOR FIELD EFFECT TRANSISTOR WITH CARBON NANOTUBE GATE

BACKGROUND

Technical Field

The present disclosure relates to transistors including nanostructures, such as carbon nanotubes incorporated therein.

Description of the Related Art

The dimensions of electrical devices, such as semiconductor devices, transistors, etc., have been steadily shrinking over the last thirty years or so, as scaling to smaller dimensions leads to continuing device performance improvements. There is a demand for transistors with operating frequencies as high as possible for various civilian and military applications in the RF, millimeter wave and terahertz wave regions. Metal-semiconductor field-effect transistor (MESFET) devices and high-electron-mobility transistor (HEMT) devices based on type III-V semiconductor could provide excellent frequency performance, in which the device cut-off frequency increases with the reduction of gate length. However, due to the limits of conventional processing technology, reducing the gate length to a few nanometers has not been achieved.

SUMMARY

In one aspect, a method is provided for forming an electrical device that includes forming ohmic contacts to a type III-V semiconductor substrate; and depositing dielectric layer on the ohmic contacts and an exposed surface of the type III-V semiconductor substrate. In a following process step, the method continues with positioning a nanotube on a surface of the dielectric layer that is overlying the type III-V semiconductor substrate and is between the ohmic contacts using chemical recognition. The dielectric layer is removed, wherein the nanotube repositions directly on a channel region of the type III-V semiconductor substrate between the ohmic contacts.

In another embodiment, the method for forming the electrical device includes providing source and drain regions in a type III-V semiconductor substrate. Ohmic contacts are formed to the source and drain regions in the type III-V semiconductor substrate. A dielectric layer is formed on the ohmic contacts and an exposed surface of the type III-V semiconductor substrate. In a following process step, the method continues with positioning a nanotube on a surface of the dielectric layer that is overlying the type III-V semiconductor substrate and is between the ohmic contacts using chemical recognition. The dielectric layer is etched to reposition the nanotube directly on a channel region of the type III-V semiconductor substrate between the ohmic contacts. A gate contact material is formed atop the nanotube in a portion of the device outside the channel region.

In yet another aspect, a semiconductor device is provided that includes a type III-V semiconductor substrate. Source and drain ohmic contact regions are present on opposing sides of a channel region in the type III-V semiconductor substrate. A single carbon nanotube is in direct contact with the channel region of the type III-V semiconductor substrate providing a Schottky contact to the channel region.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1A:
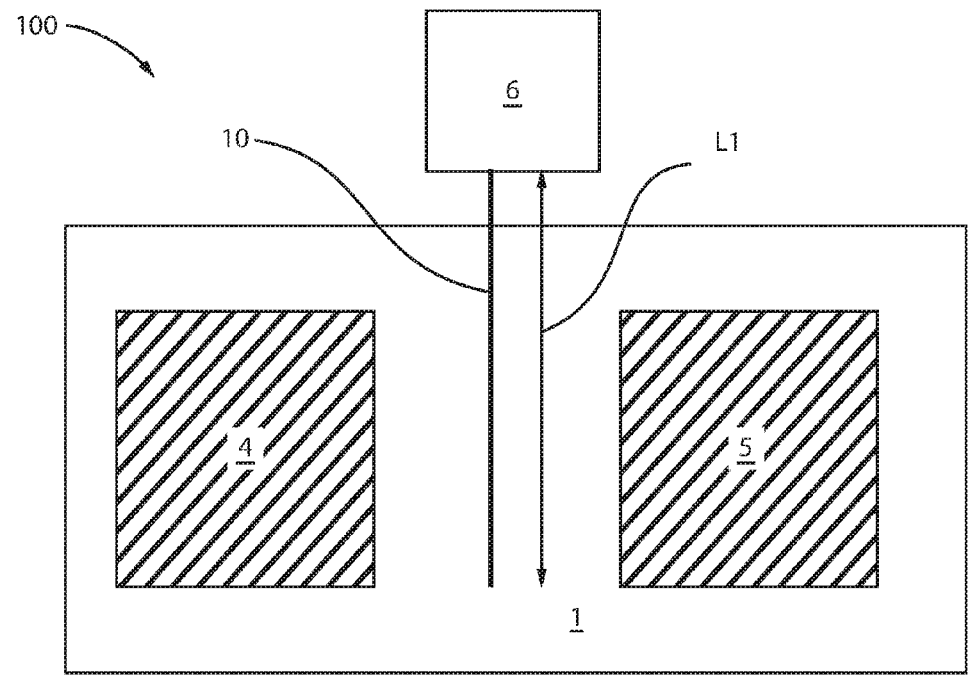
FIG. 1A is a top down view depicting a metal semiconductor field effect transistor (MESFET) device including source and drain ohmic contact regions present on opposing sides of a channel region in the type III-V semiconductor substrate; and a single carbon nanotube in direct contact with the channel region of the type III-V semiconductor substrate providing a Schottky contact to the channel region, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The methods and structures disclosed herein provide a method and structure to use a single carbon nanotube as the gate electrode of a Metal-Semiconductor-Field-Effect-Transistor (MESFET). By employing a single carbon nanotube as the gate electrode that provides the Schottky contact to the MESFET, the methods and structures described herein have a gate length dictated by the diameter of the nanotube, which in some embodiments can be 1 nm or less. This provides that the cut off frequency of the MESFETs including the carbon nanotube may range from 100 GHz to 1 THz, which is greater than the cut off frequency of MESFETs that do not include a carbon nanotube for the Schottky contact to the MESFET. Prior MEFETs composed of conventional Si and III-V, nitride semiconductor and graphene can not provide the cut off frequencies provided by the methods and structures that are described herein. Some embodiments of the methods and structures of the present disclosure are now described with reference to FIGS. 1A-6.

Figure 1B:
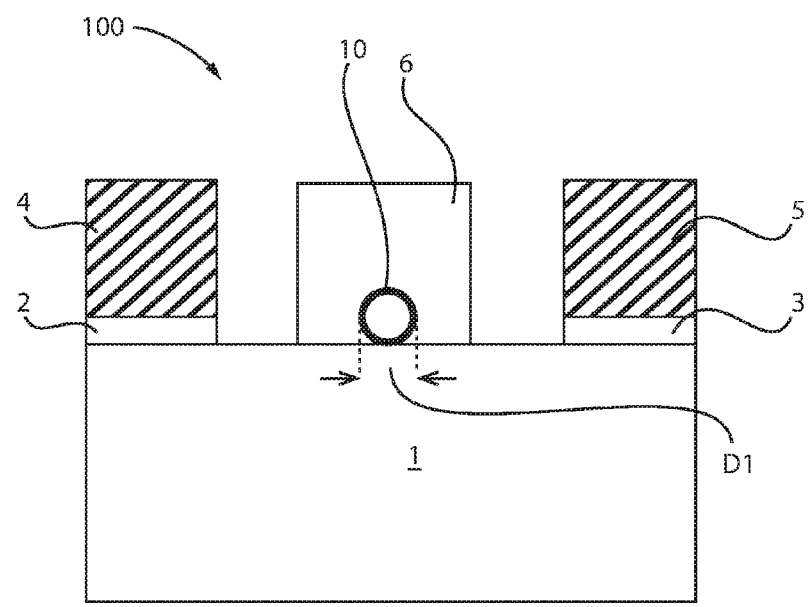
FIG. 1B is a side cross-sectional view of the structure depicted in FIG. 1A along section line B-B.

FIGS. 1A and 1B depict one embodiment of a MESFET 100 in accordance with the present disclosure. The MESFET 100 may include a conducting channel positioned between a source and drain contact regions that are contacted by source and drain ohmic contacts 4, 5. The carrier flow from source to drain is controlled by a Schottky gate, which is provided by the nanotube 10. The control of the channel is obtained by varying the depletion layer width underneath the Schottky gate, i.e., nanotube 10, which modulates the thickness of the conducting channel and thereby the current between source and drain. On advantage of the MESFET is the higher mobility of the carriers in the channel as compared to the MOSFET. The higher transit frequency of the MESFET makes it particularly of interest for microwave circuits. The advantage of the MESFET provides a superior microwave amplifier or circuit.

In some embodiments, the MESFETs 100 include a semiconductor substrate 1 that is provided by a type III-V semiconductor material. The term "III-V semiconductor material" denotes a semiconductor material that includes at least one element from Group IIIB of the Periodic Table of Elements under the Old International Union of Pure and Applied Chemistry (IUPAC) classification system, or Group 13 of the New International Union of Pure and Applied Chemistry classification system; and at least one element from Group VB of the Periodic Table of Elements, or Group 15 of the New International Union of Pure and Applied Chemistry classification system. In some embodiments, the III-V semiconductor material that provides the III-V semiconductor substrate 1 may be selected from the group of (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof. In one example, the III-V substrate 1 may be composed of aluminum gallium arsenide (AlGaAs) in a bulk semiconductor substrate configuration. Although the supplied figures depict a device formed on a bulk substrate, the present disclosure is not limited to only this example. For example, the III-V semiconductor substrate 1 may be a semiconductor on insulator (SOI) substrate, e.g., silicon on insulator substrate, or extremely thin semiconductor on insulator (ETSOI) substrate.

In one example, the use of a type III-V material, such as GaAs, as a semiconductor material for the semiconductor substrate 1 in the MESFET rather than silicon (Si) provides at least two significant advantages for the device: first, the electron mobility at room temperature is more than 5 times larger, while the peak electron velocity is about twice that of silicon. Second, it is possible to fabricate semi-insulating (SI) GaAs substrates, which eliminates the problem of absorbing microwave power in the substrate 1 due to free carrier absorption.

In some embodiments, the base material that provides the type III-V semiconductor substrate 1 is a GaAs substrate. This provides the lower portion of the type III-V semiconductor substrate that does not contain the channel region of the device and can be a semi-insulating region of the structure. A buffer layer (not shown) can be epitaxially grown over the semiconductor substrate 1 to isolate defects that may be formed in the lower portion of the type III-V semiconductor substrate 1. The channel, i.e., conducting layer, of the type III-V semiconductor substrate 1 is positioned at the uppermost portion of the substrate. The channel or conducting layer portion can be a thin and lightly doped, i.e., n-type doped (n), conducting layer of semiconducting material that can be epitaxially formed on the upper surface of the buffer layer. Because the electron mobility is typically significantly greater than hole mobility in type III-V semiconductor materials, the channel is typically n-type doped.

In some embodiments, the type III-V semiconductor material that provides at least the channel portion of the semiconductor substrate 1 is doped to an n-type conductivity. As used herein, "n-type" refers to the addition of impurities that contributes free electrons to an intrinsic semiconductor. In a type III-V semiconductor material the effect of the dopant atom, i.e., whether it is a p-type or n-type dopant, depends on the site occupied by the dopant atom on the lattice of the base material. In a III-V semiconductor, such as GaAs, atoms from group II act as acceptors, i.e., p-type, when occupying the site of a group III atom, while atoms in group VI act as donors, i.e., n-type, when they replace atoms from group V. Dopant atoms from group IV, such a silicon (Si) and germanium (Ge), have the property that they can act as acceptors or donor depending on whether they occupy the site of group III or group V atoms respectively. Such impurities are known as amphoteric impurities.

The source and drain ohmic contacts 4, 5 are present contacting the source and drain regions of the device that are present on opposing sides of the channel region of the type III-V semiconductor substrate 1. The ohmic contact is typically a low resistance junction (non-rectifying) provides current conduction from metal to semiconductor and vice versa. In some embodiments, a metal or metal semiconductor alloy component of the source and drain ohmic contacts 4, 5 may contact a source region or drain region portion of the type III-V semiconductor substrate 1 having a higher dopant concentration than the channel portion of the type III-V semiconductor substrate 1. For example, an n+region may be provided in each of the source and drain regions by ion implanting n-type dopant or forming an n-type in situ doped epitaxial semiconductor material 2, 3 on the source and drain region portions of the type III-V semiconductor substrate 1. The n-type in situ doped epitaxial semiconductor material 2, 3 may be composed of a type III-V semiconductor that is the same or different than the type III-V semiconductor material that provides the type III-V semiconductor substrate 1. It is noted that these epitaxially formed in situ doped material layers may be omitted. The metal or metal semiconductor alloy component of the source and drain ohmic contacts 4, 5 may be composed of any metal, such as titanium (Ti), platinum (Pt), palladium (Pd), gold (Au), silver (Ag), nickel (N), germanium (Ge) and combinations thereof. For example, the metal or metal semiconductor alloy component of the source and drain ohmic contacts 4, 5 may be composed of titanium, platinum, and gold alloy. In another example, the metal or metal semiconductor alloy component of the source and drain ohmic contacts 4, 5 may be composed of a titanium, palladium and gold alloy. In yet another example, the metal or metal semiconductor alloy component of the source and drain ohmic contacts 4, 5 may be composed of nickel, germanium, and silver. In one example, the ohmic metal contact 4, 5 metallurgy may include, but is not limited to Ti/Pt/Au, or Pd/Au for p-type semiconductor devices, and Ge/Ni/Au, or Ni/Ag for n-type semiconductor devices.

Still referring to FIGS. 1A and 1B, a carbon nanotube 10 is present directly on the channel region of the type III-V semiconductor substrate 1 and provides a Schottky contact. The Schottky contact is a contact that forms a Schottky barrier with the surface that the contact is directly on. A Schottky barrier is a potential barrier formed at a metal semiconductor junction that has rectifying characteristics. In the present case, the metal component of the barrier is provided by the carbon nanotube 10, and the semiconductor component of the barrier is provided by the upper surface of the channel portion of the type III-V semiconductor substrate 1.

As used herein, the term "nanotube" is meant to include single wall and multi-wall nanotubes. In one embodiment, a carbon nanotube 10 is at least one graphene layer wrapped into a cylinder. In one embodiment, a single wall carbon nanotube 10 is a graphene rolled up into a seamless cylinder with diameter of the order of a nanometer. A multi-wall carbon nanotube 10 is a plurality of graphene sheets rolled up into a seamless cylinder with diameter of the order of a nanometer. More specifically, the diameter D1 of the carbon nanotube 10 may be equal to 1 nm or 2 nm or a value between 1 nm and 2 nm. As depicted in FIGS. 1A and 1B, the longest dimension L1 of the carbon nanotube 10 may extend along a dimension that is perpendicular to the channel length that separates the source region from the drain region of the device. In one embodiment the greatest dimension L1 of the carbon nanotube 10, as used in accordance with the methods and structures described herein ranges from about 0.5 nanometers to about 10 microns. In another embodiment, the greatest dimension L1 of a single wall nanotube ranges from about 100 nanometers to about 10 millimeters. In one embodiment, the nanotubes used in accordance with the methods and structures disclosed herein have an aspect ratio of length, i.e., longest dimension L1, to width, i.e., diameter D1, on the order of approximately 1,000:1.

In one embodiment, carbon nanotubes 10 that are used in accordance with the methods and structure disclosed herein are originally produced by laser ablation have a high purity. The carbon nanotubes disclosed herein may also be originally produced using chemical vapor deposition. In one embodiment, the carbon nanotubes 10 may have a high purity on the order of about 90% carbon or greater. In another embodiment, the carbon nanotubes 10 may have a high purity on the order of about 95% to about 99% carbon. In an even further embodiment, the carbon nanotubes 10 have a purity that is greater than 99% carbon.

Referring to FIGS. 1A and 1B, it is noted that a single, as in one, carbon nanotube 10 is positioned on the channel of the type III-V semiconductor substrate 1 to provide the Schottky contact to the MESFET device 100. As will be further detailed in the method described with reference to FIGS. 3-6, the positioning of a single carbon nanotube 10 as the Schottky contact can be provided using chemical recognition. More specifically, the carbon nanotube 10 is aligned with a sacrificial dielectric material, i.e., the dielectric material, e.g., hafnium oxide or aluminum oxide layer, is removed prior to device finalization, using chemical recognition. The chemical recognition process may include forming a surface monolayer on the sacrificial dielectric layer and applying a surfactant to the carbon nanotube, wherein electrostatic force resulting from ion exchange between the surface monolayer and the surfactant aligns the nanotube to the channel portion of the III-V semiconductor substrate 1. The surface monolayer may be formed on sacrificial dielectric may include 4-(N-hydroxycarboxamido)-I-methylpyridinium iodide (NMPI), wherein surface monolayer includes a hydroxamic acid end group that self assembles on the sacrificial dielectric layer. The surfactant on the carbon nanotube 10 can be provided by sodium dodecyl sulphate (SDS). Following formation of the surface monolayer on the sacrificial dielectric and encapsulation of the carbon nanotube 10 in the surfactant, the carbon nanotubes and the semiconductor substrate 1 are brought together in an aqueous solution during which the chemical recognition process positions a single carbon nanotube 10 on the channel region of the III-V semiconductor substrate 1. As will be further described below, the orientation of the single carbon nanotube 10 is further aided by the use of masking.

Still referring to FIGS. 1A and 1B, the application of a single carbon nanotube 10 for the Schottky contact of the MESFET device 100 provides a gate length that is dictated by the diameter D1 of the single carbon nanotube 10, which is on the order of 1 nm to 2 nm. MESFET devices based on III-V semiconductor materials provide excellent frequency performance, with the device cut-off frequency increasing with the reduction of gate length. The gate lengths provided by the nanoscale diameter D1 of the carbon nanotube 10 provides that the cut off frequency of the MESFETs 100 described herein may range from 100 GHz to 1 THz, which is greater than the cut off frequency of MESFETs that do not include a carbon nanotube for the Schottky contact to the MESFET.

Still referring to FIGS. 1A and 1B, the a gate contact 6 may be formed in an electrical contact with a portion of the single carbon nanotube 10 that is not present on the channel region of the type III-V semiconductor substrate 1. Typically, the gate contact 6 is not present on an active portion of the MESFET 100, but is present on an insulating portion of the MESFET 100. The gate contact 6 may be composed of any electrically conductive material, such as copper, aluminum, silver, gold, platinum, tungsten, titanium, etc.

Figure 2:
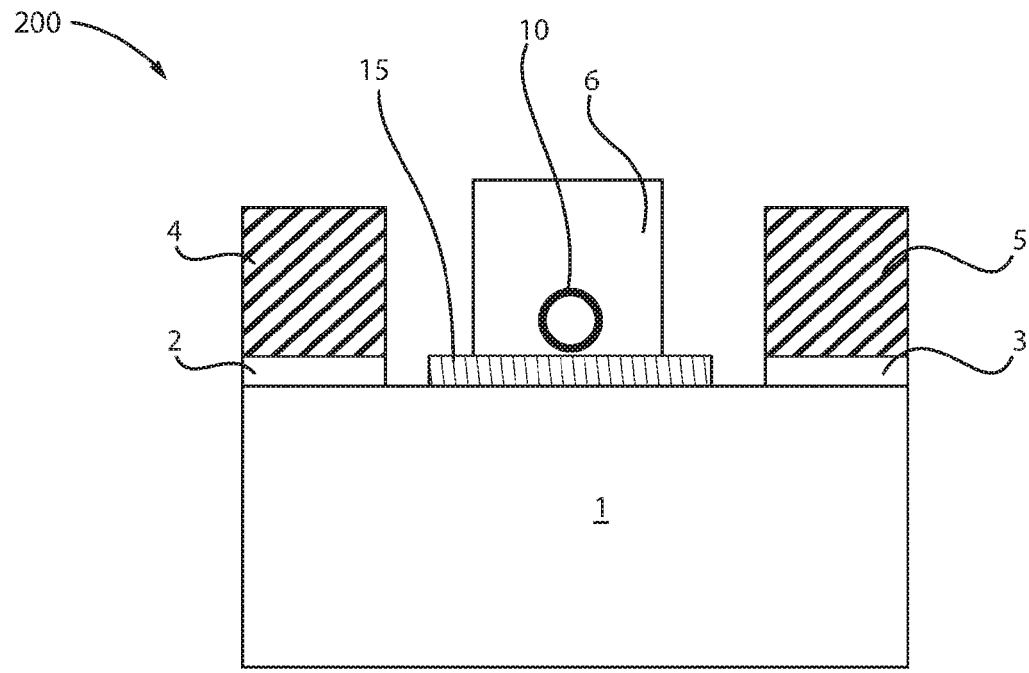
FIG. 2 is a side cross-sectional view of a high electron mobility transistor (HEMT) device including a single carbon nanotube as the Schottky contact to the device.

FIG. 2 depicts a high electron mobility transistor (HEMT) device 200 including a single carbon nanotube 10 as the Schottky contact to the device. A high-electron-mobility transistor (HEMT), also known as heterostructure FET (HFET) or modulation-doped FET (MODFET), is a field-effect transistor incorporating a junction between two materials with different band gaps (i.e. a heterojunction) as the channel region of the device instead of a doped region (as is generally the case for MOSFET). HEMT uses a high bandgap semiconductor as the barrier layer between the gate metal and the semiconductor channel. The gate is also formed by a metal/semiconductor Schottky junction, similar to MESFET.

In the embodiment depicted in FIG. 2, the layer identified by reference number 15 provide a first layer in the channel region having a first band gap, and the semiconductor substrate 1 that the layer identified by reference number 15 is in direct contact with may provide the second layer in the channel region having the second band gap, in which the first band gap is different than the second band gap.

For example, the type III-V semiconductor substrate 1 may be provided by GaAs, and the layer identified by reference number 15 may be provided by AlGaAs. It is noted that this is only one example of a combination of material combinations that may provide the heterojunction in the channel region of the HEMT device 100, in which there is wide variation of material combinations within the scope of the disclosure, dependent on the application of the device. For example, devices incorporating more indium generally show better high-frequency performance, while gallium nitride HEMTs are suitable for high-power performance. HEMT transistors that are typically able to operate at higher frequencies than ordinary transistors.

The channel region of the HEMT device 200 may include modulation doping. The term "modulation doping" refers to the fact that the dopants are spatially in a different region from the current carrying electrons. To allow conduction, semiconductors are doped with impurities which donate either mobile electrons or holes. However, these electrons are slowed down through collisions with the impurities (dopants) used to generate them in the first place. HEMTs avoid this through the use of high mobility electrons generated using the heterojunction of a highly doped wide-bandgap n-type donor-supply layer, e.g., the AlGaAs in the layer identified by reference number 15, and a non-doped narrow-bandgap channel layer with no dopant impurities, e.g., the underlying GaAs of the type III-V semiconductor substrate 1.

The electrons generated in the thin n-type AlGaAs layer drop completely into the GaAs layer to form a depleted AlGaAs layer, because the heterojunction created by different band-gap materials forms a quantum well (a steep canyon) in the conduction band on the GaAs side where the electrons can move quickly without colliding with any impurities because the GaAs layer is undoped, and from which they cannot escape. The effect of this is to create a very thin layer of highly mobile conducting electrons with very high concentration, giving the channel very low resistivity, i.e., high electron mobility.

With the exception of the channel region of the HEMT device 200, the remaining structures of the HEMT device 200 depicted in FIG. 2 are similar to the structures having the same reference numbers in the MESFET device depicted in FIG. 1. Therefore, the description of the ohmic contacts 4, 5 and the carbon nanotube 10 for the MESFET 100 that is depicted in FIG. 1 is suitable for providing the description of some embodiments of these same structures having the same reference numbers in the depiction of the HEMT device 200 illustrated in FIG. 2.

The application of a single carbon nanotube 10 for the Schottky contact of the HEMT device 200 provides a gate length that is dictated by the diameter D1 of the single carbon nanotube 10, which is on the order of 1 nm to 2 nm. The gate lengths provided by the nanoscale diameter D1 of the carbon nanotube 10 provides that the cut off frequency of the HEMT devices 200 described herein may range from 100 GHz to 1 THz.

Some embodiments of the structures depicted in FIGS. 1A-2 are now further described with a description of some embodiments for methods of forming MESFET and HEMT devices 100, 200 including a Schottky contact composed of a single carbon nanotube 10 to the channel region of the device, as illustrated with reference to FIGS. 3-6.

Figure 3:
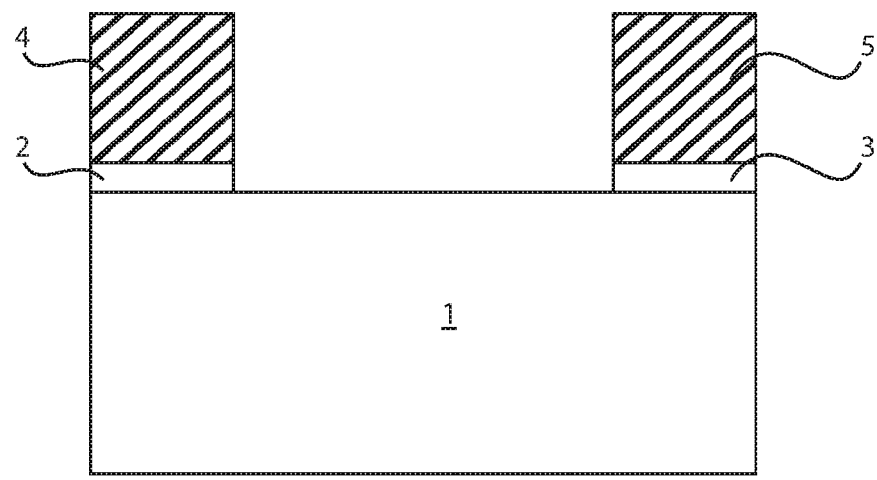
FIG. 3 is a side cross-sectional view depicting forming ohmic contacts to a type III-V semiconductor substrate, in accordance with one embodiment of the present disclosure.

FIG. 3 illustrates one embodiment of forming ohmic contacts 4, 5 to a type III-V semiconductor substrate 1, e.g., to the source and drain region portions of a type III-V semiconductor substrate. The ohmic contacts 4, 5 may be formed by depositing a metal layer, e.g., blanket depositing, on the upper surface of the type III-V semiconductor substrate 1, and then patterning and etching the deposited metal layer to remove the portion of the layer that is present over the channel region of the type III-V semiconductor substrate 1. The metal layer that provides the ohmic contacts 4, 5 may be deposited using a physical vapor deposition process, such as plating, electroplating, electroless plating, sputtering and combinations thereof. In other embodiments, the metal layer may be deposited using chemical vapor deposition and/or atomic layer deposition.

Following deposition of the metal layer, a pattern and etch process removes the portion of the metal layer overlying the channel region of the type III-V semiconductor substrate 1. Specifically, a pattern is produced by applying a photoresist to the surface to be etched; exposing the photoresist to a pattern of radiation; and then developing the pattern into the photoresist utilizing a resist developer. Once the patterning of the photoresist is completed, the sections of the metal layer covered by the photoresist are protected, while the exposed regions of the metal layer are removed using a selective etching process that removes the unprotected regions to expose the upper surface of the type III-V semiconductor substrate 1 in the channel region. The portions of the metal layer that remain following the etch step provides the ohmic contacts 4, 5. The selective etch process may be an anisotropic etch, such as reactive ion etch, or an isotropic etch, such as a wet chemical etch. Next the photoresist pattern is removed.

Figure 4:
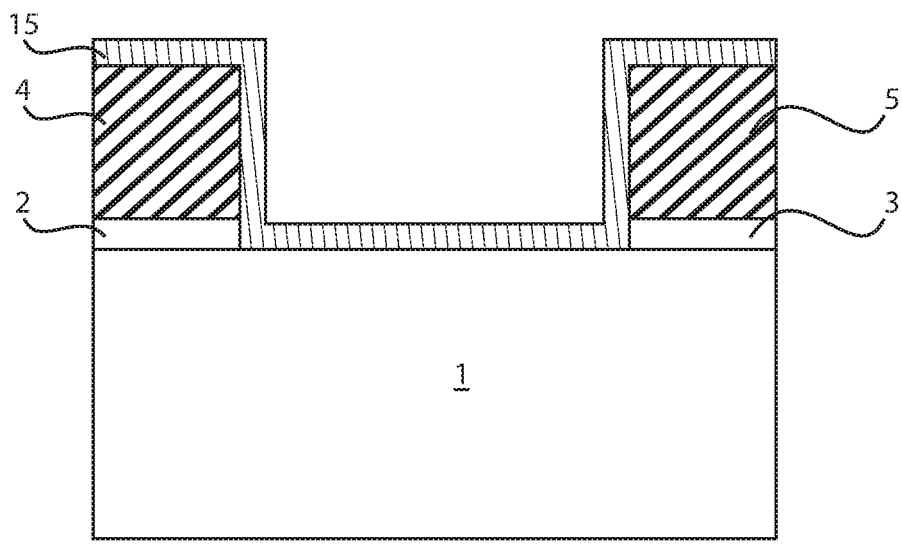
FIG. 4 is a side cross-sectional view depicting depositing a dielectric layer on the ohmic contacts and an exposed surface of the type III-V semiconductor substrate, in accordance with one embodiment of the present disclosure.

FIG. 4 depicts depositing a dielectric layer 15 on the ohmic contacts 4, 5 and an exposed surface of the type III-V semiconductor substrate 1. The dielectric layer 15 may be composed of hafnium oxide ($HfO_2$), aluminum oxide ($Al_2O_3$), or other basic metal oxides, or a combination thereof. The composition of the dielectric layer is typically selected to be bonded with a later deposited monolayer that interacts with an anionic surfactant that encapsulates the carbon nanotube for the chemical recognition process that positions the carbon nanotube 10 between the ohmic contacts 4, 5 and directly on the surface of the type III-V semiconductor substrate 1. It is noted that other materials may be suitable for the dielectric layer 15 besides hafnium oxide ($HfO_2$) and aluminum oxide ($Al_2O_3$) so long as the material selected provides the selective bonding with the later formed monolayers and surfactant that is used to align a single carbon nanotube 10 to the channel region of the type III-V semiconductor substrate 1.

The dielectric layer 15 can be a conformally deposited material layer. The term "conformal" denotes a layer having a thickness that does not deviate from greater than or less than 30% of an average value for the thickness of the layer. In some embodiments, the dielectric layer 15 may be deposited using chemical vapor deposition (CVD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed. In other embodiments, the dielectric layer 15 may also be deposited using atomic layer deposition (ALD).

Figure 5:
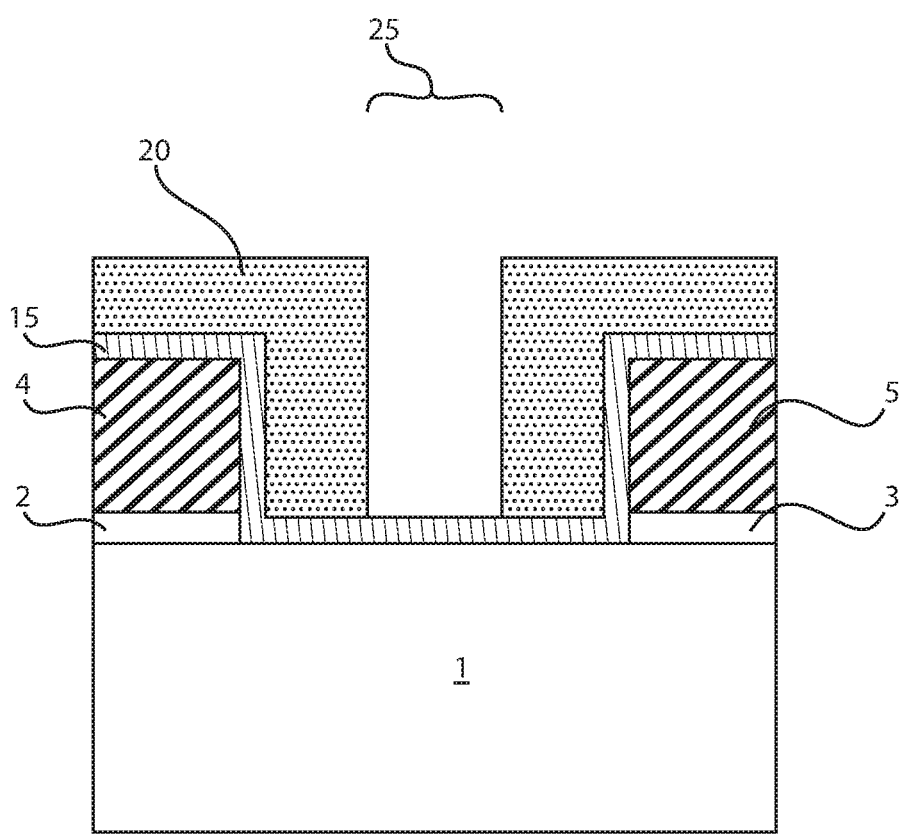
FIG. 5 is a side cross-sectional view depicting one embodiment of forming an trench in an opening between the ohmic contacts.

FIG. 5 depicts one embodiment of forming a trench 25 in an opening between the ohmic contacts 4, 5. The trench 25 is formed by depositing a oxide layer 20 on the dielectric layer 5 that is present over the ohmic contacts 4, 5 and over the portion of the type III-V semiconductor substrate 1 that is present between the ohmic contacts. Following deposition, the oxide layer 20 is etched to remove the horizontally orientated portions of the oxide layer 20, wherein the vertically orientated portions of oxide layer 20 remain on the sidewalls of the ohmic contacts 4, 5. The horizontally orientated portions of the oxide layer 20 may be removed by an anisotropic etch process, such as reactive ion etch (RIE). By removing the portion of the oxide layer 20 overlying the dielectric layer 15 that is directly on the channel region portion of the type III-V semiconductor substrate, and leaving a remaining portion on the dielectric layer 15 that is directly on the sidewalls of the ohmic contacts 4, 5, etching the oxide layer 20 provides a trench 25 having dimensions that contributes to orientating a single carbon nanotube on the channel region of the device. First, the oxide layer 20, e.g., oxide layer 20 composed of silicon oxide ($SiO_2$), has a surface charge that does not contribute to the chemical recognition process that is used to position the carbon nanotube 10 on the channel region of the type III-V semiconductor substrate 1. Further, the dimensions of the trench 25 are selected so that only one carbon nanotube 10 that can be present in the trench 25, in which the longest dimension L1 of the single carbon nanotube 10 is perpendicular to the channel length.

Figure 6:
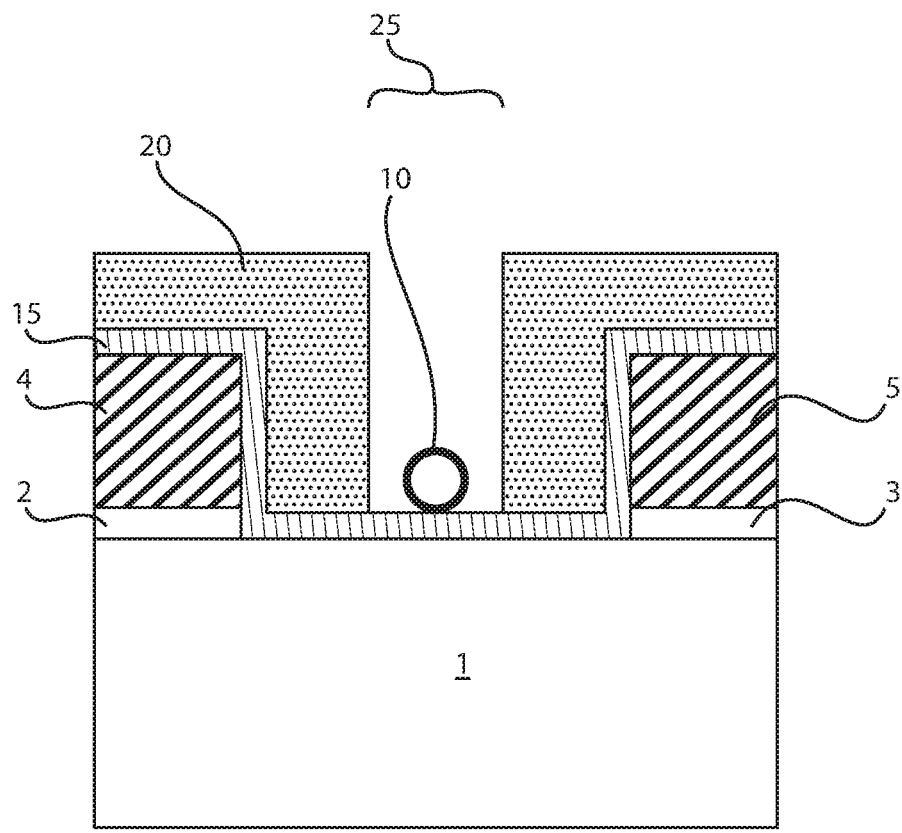
FIG. 6 is a side cross-sectional view depicting positioning a nanotube on a surface of the dielectric layer that is overlying the type III-V semiconductor substrate and is between the ohmic contacts using chemical recognition, in accordance with one embodiment of the present disclosure.

FIG. 6 depicts positioning a nanotube 10 on a surface of the dielectric layer 15 that is overlying the type III-V semiconductor substrate 1, and is between the ohmic contacts 4, 5 using chemical recognition. The chemical recognition method may include the use of an electrostatic force that results from ion exchange between a surface monolayer that is formed on the dielectric layer 15 and a surfactant encapsulating a carbon nanotube 10 that aligns the nanotube 10 to the channel portion of the III-V semiconductor substrate 1.

The surface monolayer is formed on the dielectric layer 15 that is present on the channel region of the type III-V semiconductor substrate 1 from 4-(N-hydroxycarboxamido)-I-methylpyridinium iodide (NMPI). In some embodiments, other monolayers that contains a hydroxamic acid end group, or combinations thereof, can be used instead. In some embodiments, in which the dielectric layer 15 is composed of hafnium oxide ($HfO_2$), the surface monolayer includes a hydroxamic acid end group that self assembles on the hafnium oxide ($HfO_2$) but not on silicon oxide ($SiO_2$).

In some embodiments, the surface monolayer formed on the dielectric layer 15 can be formed from NMPI molecules that may be synthesized in two steps from the methyl isonicotinate. Methyl isonicotinate can be converted to its corresponding hydroxamic acid, 4-(N-hydroxycarboxamido)pyridine. Methyl iodide (10 g) can then be added to a solution of 4-(Nhydroxycarboxamido)pyridine (5.14 g, 0.03 mol) in 200 ml of methanol, and the mixture may be stirred at room temperature for 3 days. The precipitate is filtered and washed with methanol and dried. Crystallization from 9:1 ethanol-water provides analytically pure pyridinium compound NMPI as light yellow crystals (7.35 g, 84%).

The surfactant on the carbon nanotube 10 can be provided by sodium dodecyl sulphate (SDS). The surfactant is an anionic surfactant. The carbon nanotubes 10 are functionalized by positioning the carbon nanotubes in an aqueous solution in which the anionic surfactant, e.g., SDS, is added or present. In some embodiments, the anionic surfactant wraps around the carbon nanotubes 10 leading to strong coulombic attraction between the negatively charged surfactant and the positively charged monolayer. The anionic surfactant is not limited to only SDS, in which the anionic surfactant may also be a carboxylate, a sulphonate, a petroleum solphonate, alkybenzenesulphonates, napthalenensulphonate, olefin oils and fats, sulphated esters, sulphated alkanolamides, and alkylphenols that are either ethoxylated or sulphated.

In some embodiments, to functionalize the carbon nanotubes, a solution of carbon nanotubes is formed with 1% aqueous SDS prepared via horn sonication. The solution may be then purified using a step-gradient ultracentrifugation process. The purified nanotube solution sedimented at the interface of the two layers while the graphitic impurities and large bundles settled to the bottom of the centrifuge tube. The purified nanotube solution was then removed via pipette and diluted 1:1 with 1% aqueous SDS solution.

In some embodiments, the sequence of monolayer formation on the dielectric layer 15 and functionalization of the carbon nanotubes 10 includes cleaning the dielectric layer 15 by oxygen plasma at 300 mtorr for 5 min. In one example, the NMPI monolayer may then be assembled on the exposed surface of the dielectric layer 15 by placing the structure including the dielectric layer 15 in a 3.5 mM solution of NMPI (3:1 ethanol/water) for 1 h. The surface of the dielectric layer 15 may then be rinsed with ethanol. The structure, i.e., MESFET/HEMT structure, can then be horizontally with its surface facing upwards in a dialysed nanotube solution for 1 h, without an agitation. A single carbon nanotubes 10 selectively deposits on the exposed portion of the dielectric layer 15 within the trench 25 on the channel region of the type III-V semiconductor substrate 1. After nanotube deposition, the MESFET/HEMT structure can be rinsed flowing deionized water for 30 seconds and subsequently rinsing the structures in a sonication bath with deionized water for 1 min.

It is noted that the above description provides one example of a chemical recognition process that can position a nanotube 10 on the surface of the dielectric layer 15 that is overlying the type III-V semiconductor substrate 1 and is between the ohmic contacts 4, 5. The oxide material 20 that provides the trench 25 does not interact with the chemical recognition process, and the dimensions of the trench 25 facilitate the positioning of the longest dimension L1 of the carbon nanotube 10 to be perpendicular to the gate length. In addition to the chemical recognition process for depositing the single carbon nanotube 10 within the trench 25, the trench dimensions of the repulsive force of the negatively charged carbon nanotubes 10 provides that only one single carbon nanotube 10 can be positioned in the trench 25.

Figures 7A, 7B:
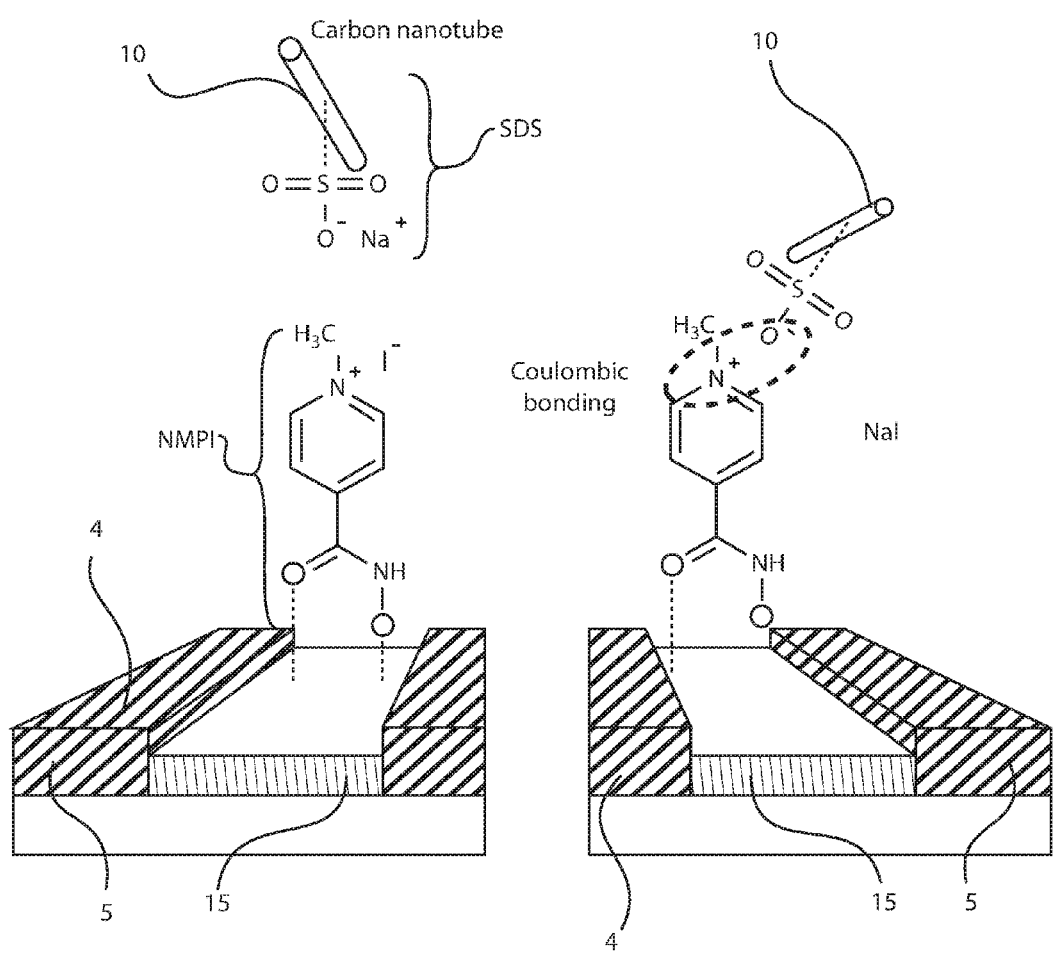
FIG. 7A is an illustration depicting the formation of the monolayer on a dielectric layer of hafnium oxide ($HfO_2$) using NMPI for engaging carbon nanotubes to the dielectric layer.
FIG. 7B is an illustration depicting the Coulombic reaction between the monolayer formed from NMPI and the carbon nanotube that has been functionalized with SDS that positions the carbon nanotube within the trench directly on the portion of the dielectric layer.

FIGS. 7A and 7B illustrate the chemical recognition process. FIG. 7A illustrates the formation of the monolayer on a dielectric layer of hafnium oxide ($HfO_2$) using NMPI. FIG. 7A also illustrates the carbon nanotube 10 being functionalized with SDS. FIG. 7B depicts the Coulombic reaction between the monolayer formed from NMPI and the carbon nanotube 10 that has been functionalized with SDS that positions the carbon nanotube 10 within the trench 25 directly on the portion of the dielectric layer 15 that is overlying the type III-V semiconductor substrate 1.

Following positioning of the carbon nanotube 10 on the dielectric layer 15 that is present within the trench 25, the dielectric layer 15, as well as the oxide material 20, is removed using a selective etching process. The removal of the dielectric layer 15 repositions the carbon nanotube 10 directly on the channel region of the type III-V semiconductor substrate between the ohmic contacts 4, 5. The selective etch process may include an isotropic gas or plasma etch.

In a following process the gate contact 6 may be formed. The gate contact 6 may be composed of any metal such, as aluminum, copper, silver, gold, titanium, tungsten and combinations thereof. The gate contact 6 may be formed using a deposition process, such as physical vapor deposition (PVD) that is followed by patterning using photolithography and etch. processes.

It is to be understood that aspects of the present invention will be described in terms of a given illustrative architecture; however, other architectures, structures, substrate materials and process features and steps can be varied within the scope of aspects of the present invention.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $SixGe1-x$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming an electrical device comprising:
   forming ohmic contacts to a type III-V semiconductor substrate;
   depositing a dielectric layer on the ohmic contacts and an exposed surface of the type III-V semiconductor substrate in a linear shaped trench between the ohmic contacts;
   positioning a linear nanotube on a surface of the dielectric layer that is overlying the type III-V semiconductor substrate and within the linear shaped trench between the ohmic contacts using chemical recognition, wherein said chemical recognition includes forming a surface monolayer on the dielectric layer and applying a surfactant to the linear nanotube, wherein electrostatic force resulting from ion exchange between the surface monolayer and the surfactant aligns the linear nanotube to a channel region of the III-V semiconductor substrate within the linear shaped trench; and
   removing the dielectric layer so that the linear nanotube is repositioned directly on the type III-V semiconductor substrate within the linear shaped trench to provide a Schottky contact to the channel region of the type III-V semiconductor substrate.

2. The method of claim 1, wherein the ohmic contacts comprise a metal in direct contact with an n+ doped region in the type III-V semiconductor substrate.

3. The method of claim 2, wherein the channel region of the electrical device is doped to an n-type conductivity, wherein a dopant concentration of the channel region is less than the n+ doped region that the ohmic contacts are in direct contact with.

4. The method of claim 1, wherein forming the ohmic contacts comprises depositing a metal layer on the type III-V semiconductor substrate and removing a portion of the metal layer overlying the channel region of the type III-V semiconductor substrate.

5. The method of claim 1, wherein the dielectric layer comprises a hafnium including oxide.

6. The method of claim 1, wherein the dielectric layer is a high-k dielectric layer, and said chemical recognition comprises forming a surface monolayer on the high-k dielectric layer and applying a surfactant to the linear nanotube, wherein electrostatic force resulting from ion exchange between the surface monolayer and the surfactant aligns the linear nanotube to the channel region of the III-V semiconductor substrate.

7. The method of claim 6, wherein the surface monolayer is formed from 4-(N-hydroxycarboxamido)-I-methylpyridinium iodide (NMPI), wherein the surface monolayer includes a hydroxamic acid end group that self assembles on the high-k dielectric layer.

8. The method of claim 7, wherein the surfactant on the linear nanotube is sodium dodecyl sulphate (SDS).

9. A method for forming an electrical device comprising:
   providing source and drain regions in a type III-V semiconductor substrate;
   forming ohmic contacts to the source and drain regions in the type III-V semiconductor substrate;
   forming a high-k dielectric layer on the ohmic contacts and an exposed surface of the type III-V semiconductor substrate that is present in a linear shaped trench between the ohmic contacts;
   positioning a linear nanotube on a surface of the high-k dielectric layer that is overlying the type III-V semiconductor substrate and is between the ohmic contacts within the linear shaped trench using chemical recognition, wherein said chemical recognition includes forming a surface monolayer on the high-k dielectric layer and applying a surfactant to the liner nanotube, wherein electrostatic force resulting from ion exchange between the surface monolayer and the surfactant aligns the linear nanotube to a channel region of the III-V semiconductor substrate within the linear shaped trench;
   etching the high-k dielectric layer to reposition the linear nanotube directly on the channel region of the type III-V semiconductor substrate between the ohmic contacts; and
   forming a gate contact atop the linear nanotube that is positioned outside the channel region.

10. The method of claim 9, wherein the high-k dielectric layer comprises a hafnium including oxide.

11. The method of claim 9, wherein the surface monolayer is formed from 4-(N-hydroxycarboxamido)-I-methylpyridinium iodide (NMPI), wherein the surface monolayer includes a hydroxamic acid end group that self assembles on the high-k dielectric layer.

12. The method of claim 11, wherein the surfactant on the linear nanotube is sodium dodecyl sulphate (SDS) that can perform ion exchange with the surface monolayer self-assembled on the high-k dielectric layer.

13. The method of claim 9, wherein etching the high-k dielectric layer to reposition the linear nanotube directly on the channel region of the type III-V semiconductor substrate between the ohmic contacts comprises an isotropic gas or plasma etch.

14. The method of claim 9, wherein the gate contact is metal.

* * * * *